(12) United States Patent
Kruijt-Stegeman et al.

(10) Patent No.: US 7,922,474 B2
(45) Date of Patent: Apr. 12, 2011

(54) IMPRINT LITHOGRAPHY

(75) Inventors: Yvonne Wendela Kruijt-Stegeman, Eindhoven (NL); Henricus Wilhelmus Aloysius Janssen, Eindhoven (NL); Aleksey Yurievich Kolesnychenko, Helmond (NL); Helmar Van Santen, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 755 days.

(21) Appl. No.: 11/155,941

(22) Filed: Feb. 17, 2005

(65) Prior Publication Data
US 2006/0180952 A1    Aug. 17, 2006

(51) Int. Cl.
*B29C 59/00* (2006.01)
*B29C 59/02* (2006.01)

(52) U.S. Cl. ............... 425/385; 425/389; 425/405.1; 977/887

(58) Field of Classification Search .......... 977/887; 425/385, 405.1, 405.2, 389, 390
See application file for complete search history.

(56) References Cited

U.S. PATENT DOCUMENTS

| | | | |
|---|---|---|---|
| 5,512,131 A | 4/1996 | Kumar et al. | 156/655.1 |
| 5,772,905 A | 6/1998 | Chou | 216/44 |
| 6,165,911 A | 12/2000 | Calveley | 438/754 |
| 6,309,580 B1 | 10/2001 | Chou | 264/338 |
| 6,334,960 B1 | 1/2002 | Willson et al. | 216/52 |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,518,189 B1 | 2/2003 | Chou | 438/706 |
| 6,656,341 B2 | 12/2003 | Petersson et al. | 205/667 |
| 6,696,220 B2 | 2/2004 | Bailey et al. | 430/272.1 |
| 6,719,915 B2 | 4/2004 | Willson et al. | 216/44 |
| 6,829,988 B2 * | 12/2004 | George et al. | 101/17 |
| 6,921,615 B2 | 7/2005 | Sreenivasan et al. | 430/22 |
| 6,943,117 B2 * | 9/2005 | Jeong et al. | 438/694 |
| 7,168,939 B2 * | 1/2007 | Bietsch et al. | 425/385 |
| 7,207,871 B1 * | 4/2007 | Zuniga et al. | 451/288 |
| 7,618,752 B2 * | 11/2009 | Stewart et al. | 430/5 |
| 2002/0093122 A1 | 7/2002 | Choi et al. | 264/401 |
| 2002/0094496 A1 | 7/2002 | Choi et al. | 430/322 |
| 2002/0132482 A1 | 9/2002 | Chou | 438/692 |
| 2002/0167117 A1 | 11/2002 | Chou | 264/338 |
| 2002/0177319 A1 | 11/2002 | Chou | 438/690 |

(Continued)

FOREIGN PATENT DOCUMENTS

JP    2003-077867 A    3/2003

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

(Continued)

*Primary Examiner* — Yogendra N Gupta
*Assistant Examiner* — Emmanuel S Luk
(74) *Attorney, Agent, or Firm* — Pillsbury Winthrop Shaw Pittman LLP (57) ABSTRACT

An imprinting method is disclosed that includes applying an imprinting force to a template to cause the template to contact an imprintable medium on a target region of a first surface of a substrate to form an imprint in the medium, during application of the imprinting force, applying a compensating force to a second surface of the substrate which is opposite to the first surface so as to reduce deformation of the substrate caused by the application of the imprinting force, and separating the template from the imprinted medium.

15 Claims, 6 Drawing Sheets

U.S. PATENT DOCUMENTS

| | | | |
|---|---|---|---|
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2003/0215577 A1* | 11/2003 | Willson et al. | 427/458 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0080734 A1* | 4/2004 | Taniguchi et al. | 355/53 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1* | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |
| 2005/0263077 A1 | 12/2005 | GanapathiSubramanian et al. | |
| 2006/0273488 A1* | 12/2006 | Seki et al. | 264/293 |

FOREIGN PATENT DOCUMENTS

| | | |
|---|---|---|
| JP | 2006-100723 A | 4/2006 |
| WO | WO 01/79591 A1 | 10/2001 |
| WO | WO 01/79592 A1 | 10/2001 |
| WO | 03/099536 A1 | 12/2003 |
| WO | 2004/086471 A1 | 10/2004 |

OTHER PUBLICATIONS

Heon Lee et al. "Full wafer scale near zero residual nano-imprinting lithography using UV curable monomer solution", Microelectronic Engineering 77, pp. 42-47, (2005).

English translation of Official Action issued on Mar. 11, 2009 in Japanese Application No. 2006-039322.

* cited by examiner

IMPRINT LITHOGRAPHY

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using light of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rate materials and are consequently very expensive.

An alternative method to printing sub-100 nm features, known as imprint lithography, comprises transferring a pattern to a substrate by imprinting a pattern into an imprintable medium using a physical mould or template. The imprintable medium may be the substrate or a material coated onto a surface of the substrate. The imprintable medium may be functional or may be used as a "mask" to transfer a pattern to an underlying surface. The imprintable medium may, for instance, be provided as a resist deposited on a substrate, such as a semiconductor material, to which the pattern defined by the template is to be transferred. Imprint lithography is thus essentially a moulding process on a micrometer or nanometer scale in which the topography of a template defines the patterns created on a substrate. Patterns may be layered as with optical lithography processes so that in principle imprint lithography could be used for such applications as integrated circuit manufacture.

The resolution of imprint lithography is limited only by the resolution of the template fabrication process. For instance, imprint lithography has been used to produce features in the sub-50 nm range with significantly improved resolution and line edge roughness compared to that achievable with conventional optical lithography processes. In addition, imprint processes may not require the expensive optics, advanced illumination sources or specialized resist materials typically required for optical lithography processes.

SUMMARY

According to a first aspect of the present invention, there is provided an imprinting method, comprising applying an imprinting force to a template to cause the template to contact an imprintable medium on a target region of a first surface of a substrate to form an imprint in the medium, during application of the imprinting force, applying a compensating force to a second surface of the substrate which is opposite to the first surface so as to reduce deformation of the substrate caused by the application of the imprinting force, and separating the template from the imprinted medium.

In this way, deformation (e.g. bending or compression) of the substrate may be reduced, minimized, or substantially eliminated, by the application of an appropriate compensatory force provided by, e.g., a suitably arranged compensating member. In an embodiment, the contact area of the compensating member employed to apply the compensating force to the second surface of the substrate may be greater than, similar to or smaller than the area of the second surface of the substrate.

While the compensating force may be applied at any convenient angle to any desirable portion of the second surface of the substrate, the compensating force is applied, in an embodiment, to a portion of the second (e.g. bottom) surface of the substrate which is directly opposite to the target region of the first (e.g. top) surface of the substrate. In doing so the magnitude of the compensating force may be reduced or minimized since its trajectory is aligned with that of the imprinting force. Conveniently, the target region of the first surface of the substrate is a fraction of the total surface area of the first surface of the substrate, i.e. the target region has a smaller surface area than the total area of the first surface of the substrate. In this case, the portion of the second surface of the substrate over which the compensating force is applied by the compensating member is, in an embodiment, a fraction of the total area of the second surface of the substrate.

In an embodiment, the compensating force is substantially equal to the imprinting force. Alternatively, the compensating force may be greater than the imprinting force so as to compensate for compression of a part of the target region of the first surface of the substrate. In an embodiment, the compensating pressure exerted on the second surface of the substrate by virtue of the application of the compensating force may be substantially equal to or greater than the imprinting pressure exerted on the imprintable medium due to the application of the imprinting force.

In an embodiment, the substrate is supported on a first surface of a carrier and the compensating force is applied by a compensating member directly contacting a second surface of the carrier which is opposite to the first surface of the carrier.

In an embodiment, the compensating force is applied using a resilient member. In an embodiment, the compensating force is applied using a compensating member selected from a group consisting of a spring, a piezoelectrically actuated member and a red displaceably mounted within a coil capable of carrying an electric current (e.g. a Lorentz motor).

In an embodiment, the imprinting method may further comprise providing a volume of this imprintable medium on the target region of the first surface of the substrate.

According to a further aspect, there is provided an imprinting method, comprising applying an imprinting force to a template to cause the template to contact an imprintable medium on a target region of the first surface of a substrate, the target region having an area less than the area of the first surface of the substrate, to form an imprint in the medium; during application of the imprinting force, applying a localized compensating force to a second surface of the substrate which is opposite to the first surface of the substrate so as to reduce deformation of the substrate caused by the application of the imprinting force; and separating the template from the imprinted medium.

The application (by any suitable means, e.g. mechanical force, fluid pressure, etc.) of an appropriate localized compensating force to a specific portion of the second surface of the substrate enables the magnitude of the compensating force to be reduced. In an embodiment, the portion or the second surface of the substrate is directly opposite to the target region of the first surface of the substrate. Thus, the trajectory of the compensating force will be aligned with that of the imprinting force allowing the magnitude of the compensating force to be reduced further. Since the target region of the first surface of the substrate is a fraction of the total surface area of the first surface of the substrate, the portion of the second surface of the substrate over which the localized compensating force is applied by the compensating member is, in an embodiment, a fraction of the total area of the second surface of the substrate.

In an embodiment, the imprinting method further comprises providing a volume of the imprintable medium on the target region of the first surface of the substrate.

According to a further aspect, there is provided a method for patterning a substrate, comprising:

applying an imprinting force to a template to cause the template to contact an imprintable medium on a target region of a first surface of a substrate to form an imprint in the medium, the imprint comprising a pattern feature and an area of reduced thickness;

during application of the imprinting force, applying a compensating force to a second surface of the substrate which is opposite to the first surface so as to reduce deformation of the substrate caused by the application of the imprinting force;

separating the template from the imprinted medium;

etching the area of reduced thickness in the medium to expose an area of the substrate; and etching the exposed area of the substrate.

The imprinting method described earlier may be incorporated in to a substrate patterning method as defined according to this aspect.

In an embodiment, the method further comprises providing a volume of the imprintable medium on the target region of the first surface of the substrate.

According to a further aspect, there is provided a method for patterning a substrate, comprising:

applying an imprinting force to a template to cause the template to contact an imprintable medium on a target region of a first surface of a substrate, the target region having an area less than the area of the first surface of the substrate, to form an imprint in the medium, the imprint comprising a pattern feature and an area of reduced thickness;

during application of the imprinting, force applying a localized compensating force to a second surface of the substrate which is opposite to the first surface of the substrate so as to reduce deformation of the substrate caused by the application of the imprinting force separating the template from the imprinted medium;

etching the area of reduce thickness in the medium to expose an area of the substrate; and etching the exposed area of the substrate.

In an embodiment, the method further comprises providing a volume of the imprintable medium on the target region of the first surface of the substrate.

According to a further aspect, there is provided an imprinting apparatus, comprising:

a substrate holder configured to hold a substrate;

a template holder configured to hold a template, the template holder being operable to apply an imprinting force to the template to cause the template to contact an imprintable medium on a target region of a first surface of the substrate to form an imprint in the medium and to cause the template to separate from the imprinted medium; and a compensating member operable to apply a compensating force, during application of the imprinting force, to a second surface of the substrate which is opposite to the first surface so as to reduce deformation of the substrate caused by the application of the imprinting force The compensating force may be applied an any convenient angle to any desirable portion of the second surface of the substrate, however, in an embodiment, the compensating member is operable to apply the compensating force to a portion of the second surface of the substrate which is directly opposite the first target region of the first surface of the substrate.

In an embodiment, the compensating member is operable to provide a compensating force which is substantially equal to or greater than the imprinting force. Furthermore, the compensating member may be operable to provide a compensating force which exerts a compensating pressure on the second surface of the substrate which is substantially equal to or greater than the imprinting pressure exerted on the imprintable medium due to the application of the imprinting force by operation of the template holder.

In an embodiment, the substrate is supported on a first surface of a carrier and the compensating member directly contacts a second surface of the carrier which is opposite to the first surface of the carrier.

In an embodiment, the compensating member is connected to the substrate holder.

In an embodiment, the compensating member may be a resilient member. In an embodiment, the compensating member is selected from a group consisting of a spring, a piezo-electrically actuated member, and a rod displaceably mounted within a coil capable of carrying an electric current (e.g. a Lorentz motor).

In an embodiment, the imprinting apparatus further comprises dosing apparatus configured to provide a volume of the imprintable medium on the target region of the first surface of the substrate held on the substrate holder.

According to a further aspect, there is provided an imprinting apparatus, comprising:

a substrate holder configured to hold a substrate;

a template holder configured to hold a template, the template holder being operable to apply an imprinting force to the template to cause the template to contact an imprintable medium on a target region of a first surface of the substrate to form an imprint in the medium, the target region having an area less than the area of the first surface of the substrate, and to cause the template to separate from the imprinted medium; and a compensating member operable to apply a localized compensating force, during application of the imprinting force, to a second surface of the substrate which is opposite to the first surface of the substrate so as to reduce deformation of the substrate caused by the application of the imprinting force.

In an embodiment, the imprinting apparatus further comprises a dosing apparatus configured to provide a volume of the imprintable medium on the target region of the first surface of the substrate held on the substrate holder.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
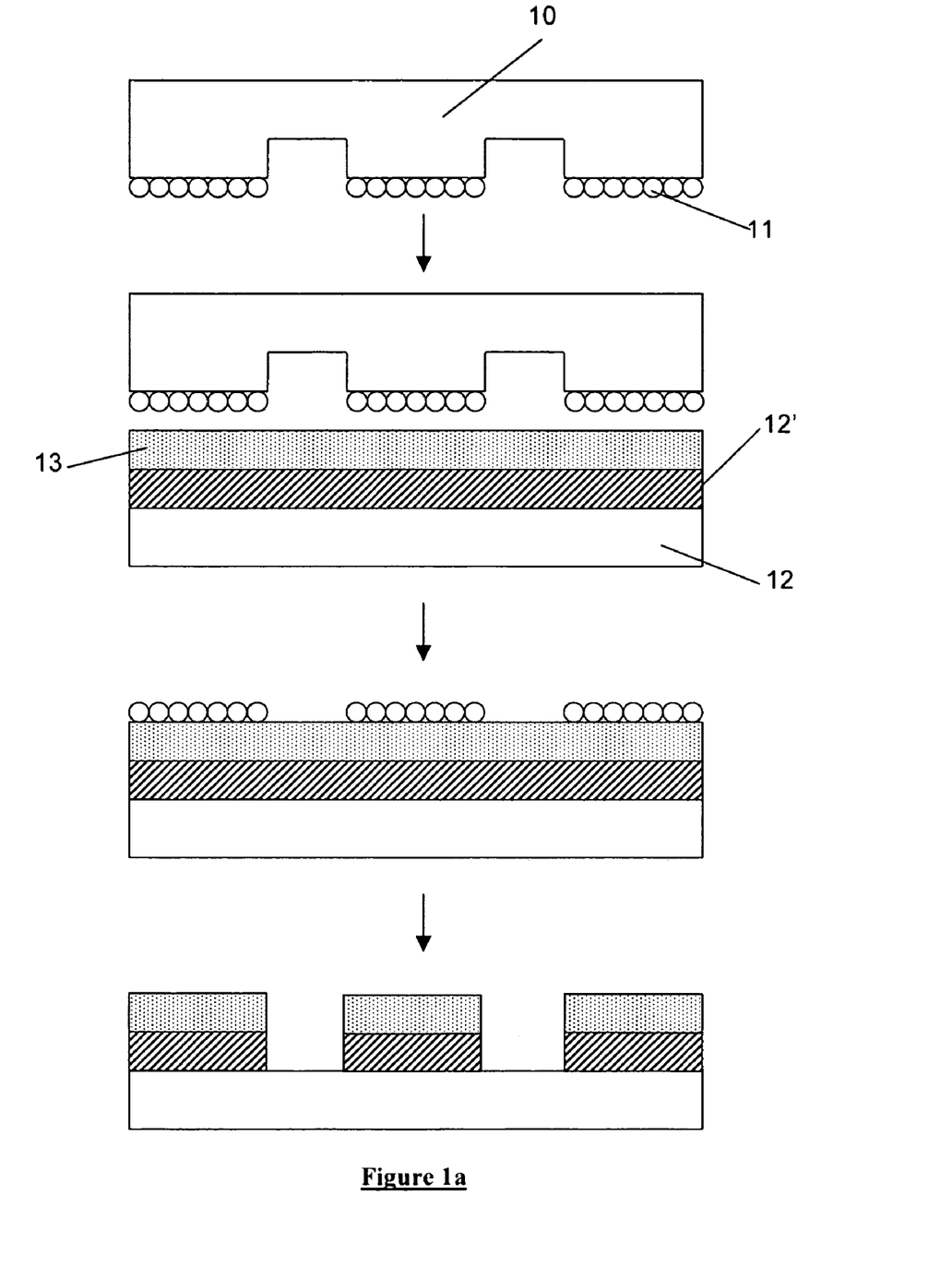
FIG. 1a-1c illustrate examples of soft, hot and UV lithography processes respectively.
Figure 1B:
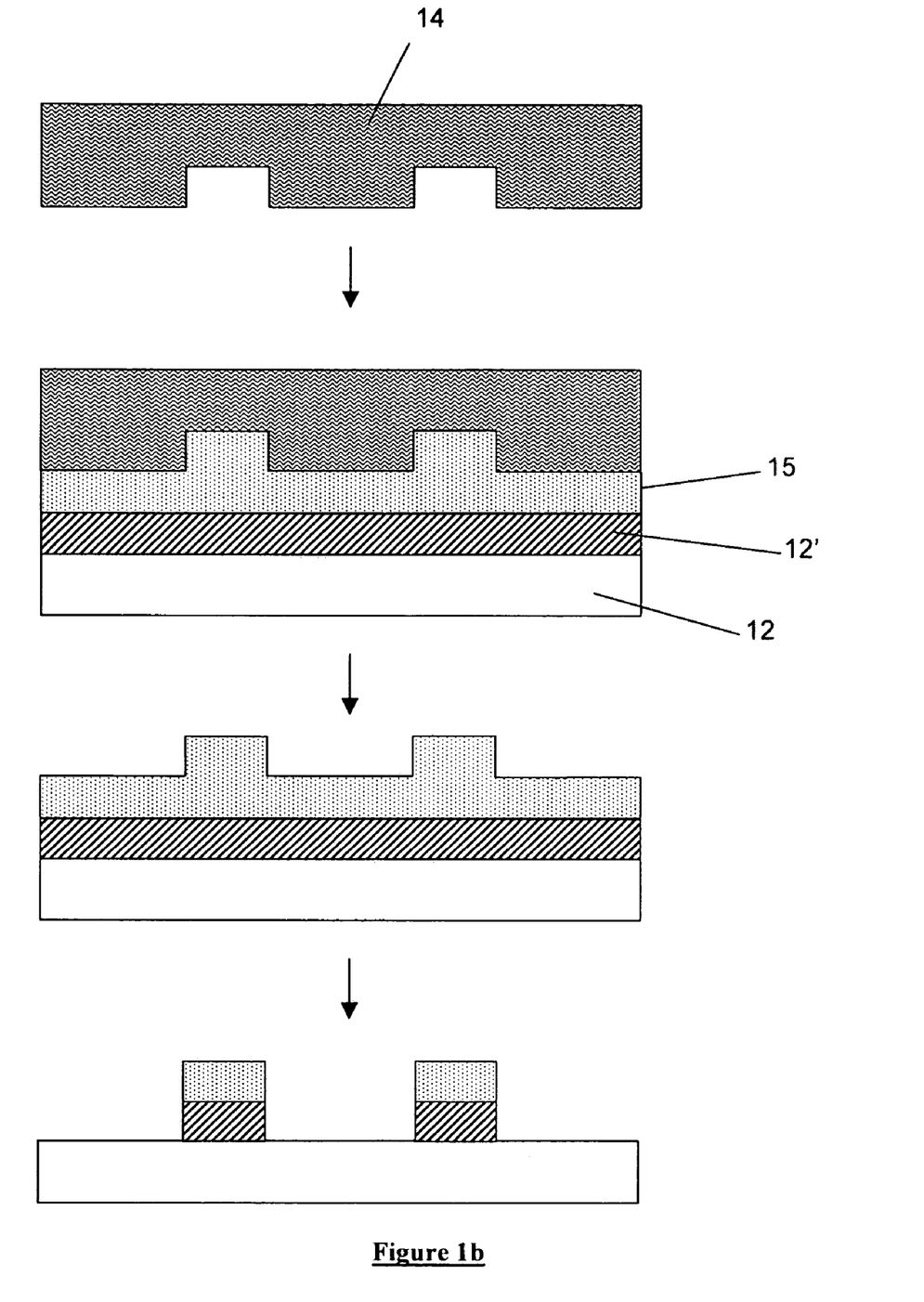
Figure 1C:
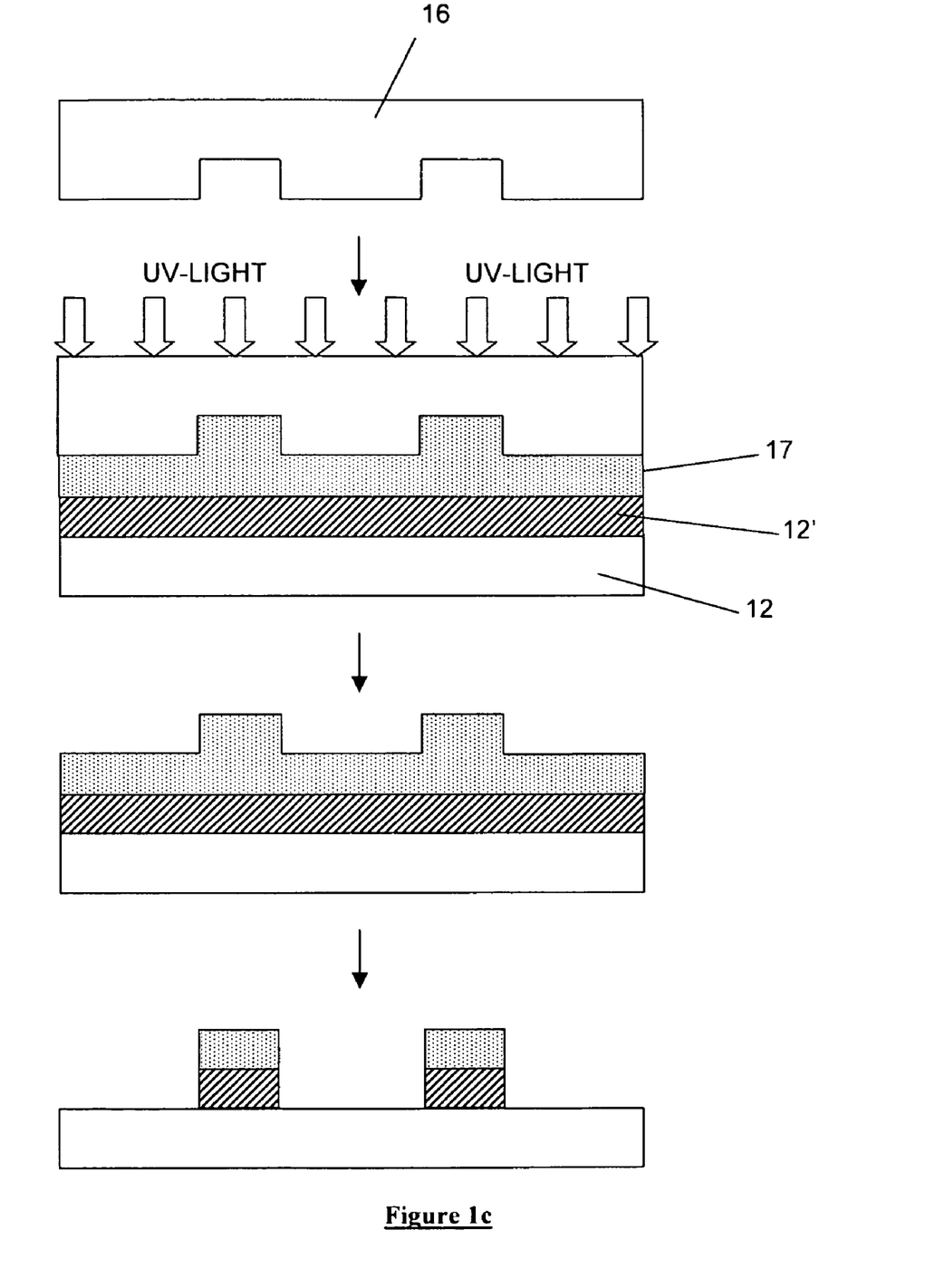

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted patter. Furthermore, when fabricating multiple layer structures, in which the same region will be overlaid multiple times, soft imprint lithography may not provide overlay accuracy on a nanometer scale.

Hot imprint lithography (or hot embossing) is also known as a nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexylmethacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
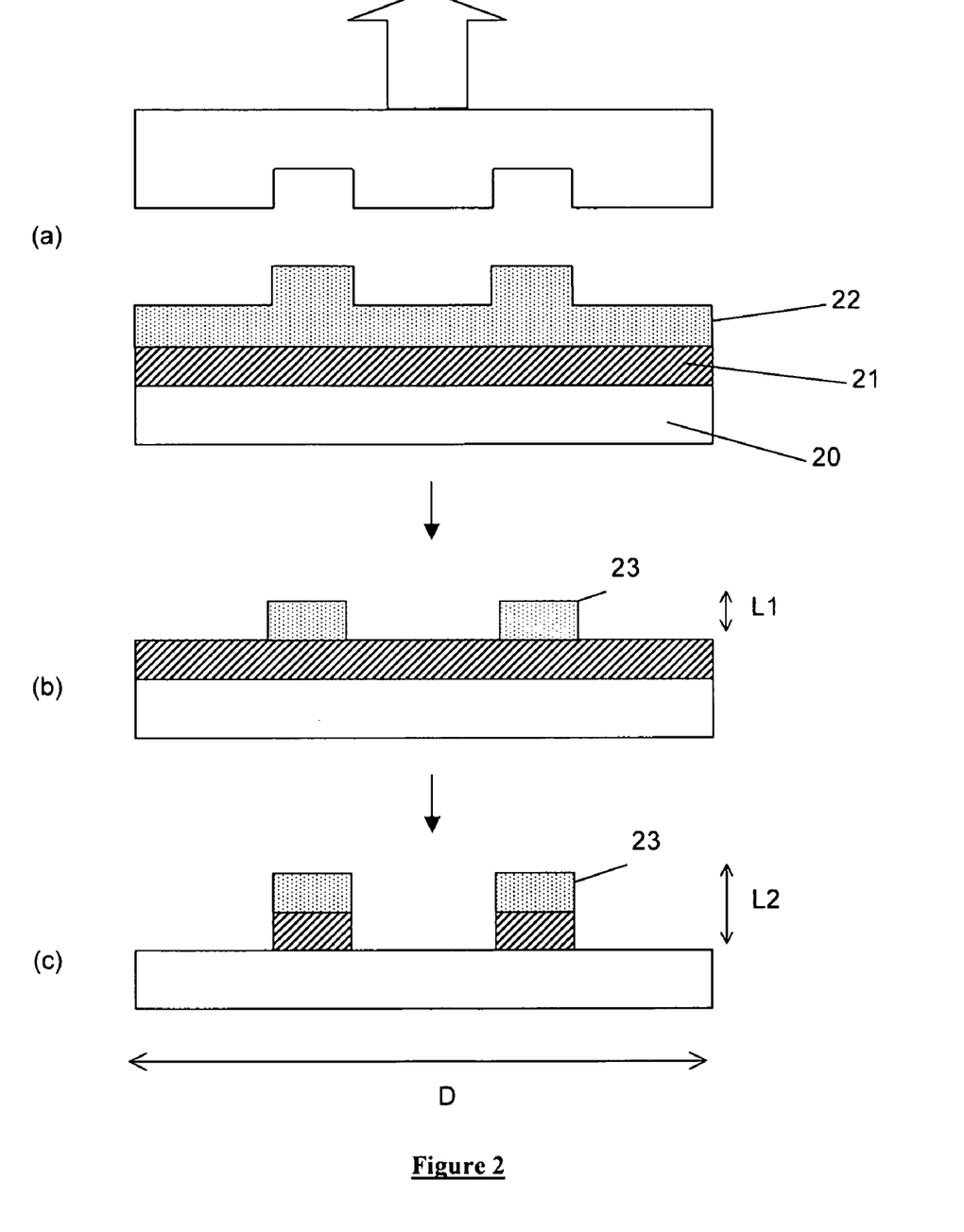
FIG. 2 illustrates a two step etching process employed when hot and UV imprint lithography is used to pattern a resist layer.

Upon removal of the template from the solidified resin, a two-stop etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ration of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure required for the imprinting step, due the viscous nature of the imprintable material, which can induce mechanical deformation in the substrate, again distorting the pattern.

UV imprint lithography, on the other hand, does not involve such high temperatures and temperature changes nor dies it require such viscous imprintable materials. Rather, UV imprint lithography involves the use of a partially or wholly transparent template and a UV-curable liquid, typically a monomer such as an acrylate or methacrylate. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology knows as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so the SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made herein to depositing UV curable liquids onto a substrate, the liquids could also be deposited on the template and in general the same techniques and considerations will apply.

Figure 3:
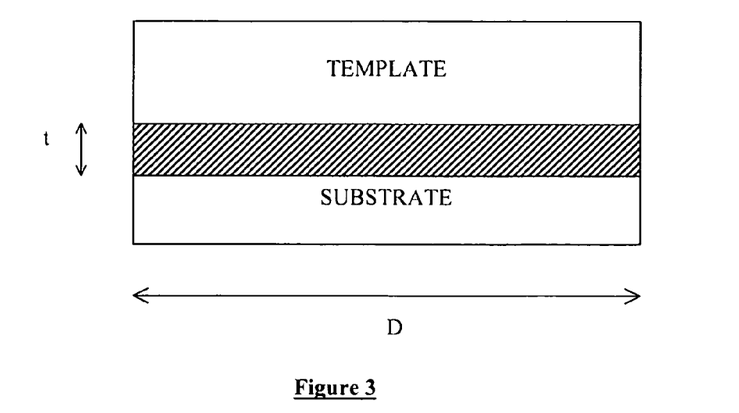
FIG. 3 illustrates relative dimensions of template features compared to the thickness of a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or overlay accuracy is required. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the required pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non-linear response, etc. For example, the functional material may form a conductive layer, a semi-conductive layer, a dielectric layer or a layer having another desirable mechanical, electrical or optical property. Some organic substances may also be appropriate functional materials. Such applications may be within the scope of the present invention.

Current imprint lithography systems may offer a significant advantage over optical lithography in terms of reduced feature size. During the stamping and curing process, the template should be lowered with sufficient force to impart its pattern into the imprintable medium. Unfortunately, this may result in the template exerting a significantly greater force on the substrate than would be experienced in optical lithography. This effect may be amplified by the fact that a higher force is commonly used than would otherwise be required in order to reduce imprint times. Thus, high imprinting forces in imprint lithography processes may cause deformation and possibly damage to the substrate, and reduced pattern replication accuracy in the imprintable medium. In particular, application of an imprinting force to a substrate can lead to bending and deformation of the substrate. If the force is applied at or near to the center of the substrate, the central part of the substrate may undergo a perpendicular displacement of up to several microns.

Figure 4:
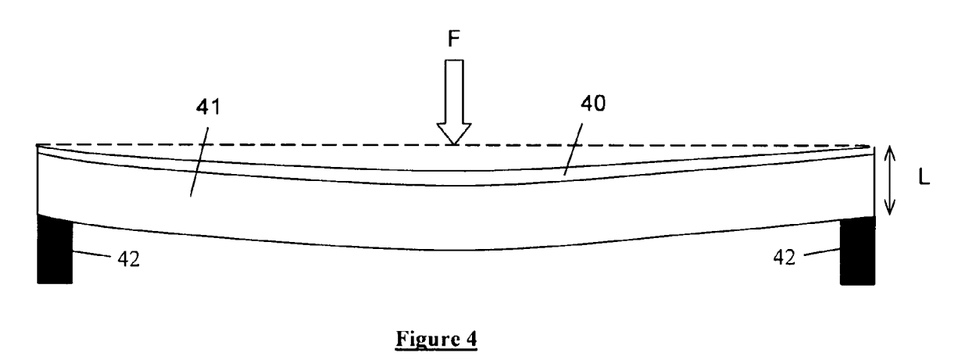
FIG. 4 illustrates flexure of a substrate when subjected to a stamping force.

FIG. 4 illustrates a thin silicon substrate 40 supported on a thick glass carrier 41 which is supported at its periphery by supporting members 42. A force F applied to an upper surface of a central part of the substrate 40 causes significant downward deflection of the substrate 40 and carrier 41 leading to deformation of a volume of imprintable medium (e.g., curable resin—not shown) provided on the upper surface of the substrate 40. Such deformation of the imprintable medium may be detrimental to the accuracy of pattern replication in the medium and therefore the substrate 40.

Figure 5:
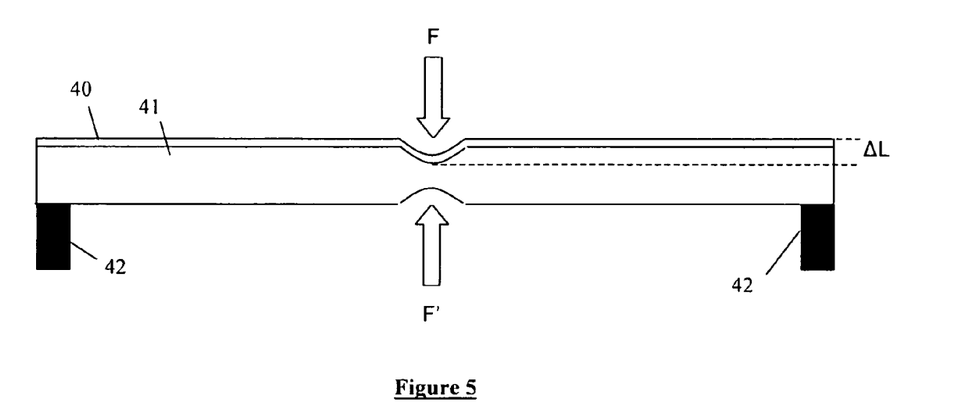
FIG. 5 illustrates provision of a counter force in accordance with an embodiment of the present invention.

FIG. 5 illustrates an embodiment in which a compensating force F' is applied underneath the substrate 40 and carrier 41, on the opposing side to which the stamping force F is applied by a template (not shown). The value of F' is chosen to be approximately equal and opposite to F. The provision of the compensating force F' substantially eliminates bending of the substrate 40 and carrier 41. There may, however, be a small localized deformation ΔL due to compression of the substrate 40 and carrier 41, which is given by ΔL-FL/EA, where L is the combined thickness of the substrate 40 and carrier 41, E is the Young's Modulus of the substrate 40 and carrier 41, A is the area of contact between the imprinting force and the substrate 40, and F is the imprinting force. If a force of 100 N is applied by a flat template of diameter 10 mm to a thin silicon substrate supported on a 20 mm thick glass carrier, the total compression of the substrate and carrier may be of the order of 400 nm. It may be desirable for the value of F' to be slightly larger than F so as to raise the area A of the substrate 40 to compensate for compression of this area of the substrate 40.

The compensating force F' is applied in an embodiment via a spring or other compensating member positioned beneath the substrate. In a further embodiment in which multiple regions of the substrate are to be patterned, the spring or other compensating member is moveable underneath the substrate in accordance with movement of the template above the substrate so as to maintain the effectiveness of the "cushioning" provided by the spring. Alternatively, a plurality of springs or other compensating members may be provided beneath the substrate. In an embodiment, the other compensating member may be a piezoelectrically actuated member and/or a rod displaceably mounted within a coil capable of carrying an electric current (e.g. a Lorentz motor).

It is noted above that the substrate will incur damage if subjected to a force above a particular threshold. The force imparted by the template to the substrate can be held below this threshold by placing the template in a caddy which releases the template if the force is above the threshold.

Figure 6:
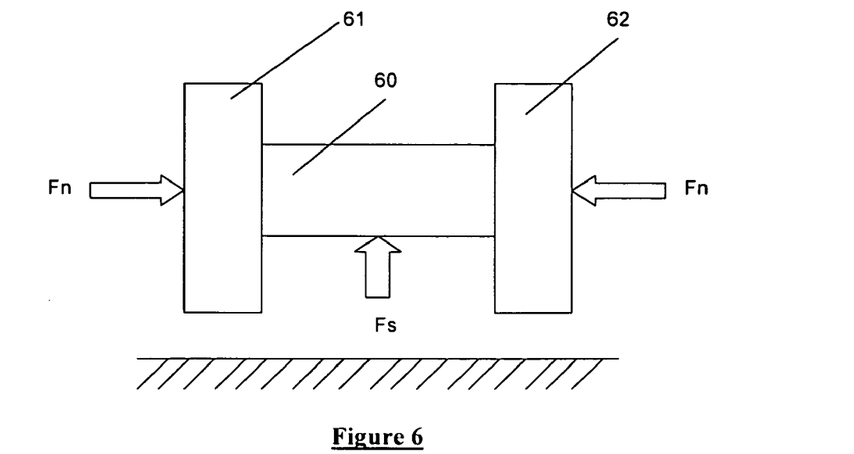
FIGS. 6, 7 and 8 illustrate mechanisms for releasing a template.

As an example, FIG. 6 shows a template 60 held between two arms 61 and 62 by virtue of the frictional force between the surfaces in contact. Normal forces $F_n$ are applied to the arms to hold the template 60 in place. If the reactive force $F_s$ between the template and the substrate area exceeds the value $F_n \times \mu$, (where $\mu$=friction coefficient) the template will be released from the two arms and allowed to move upwards before it causes unwanted damage.

Figure 7:
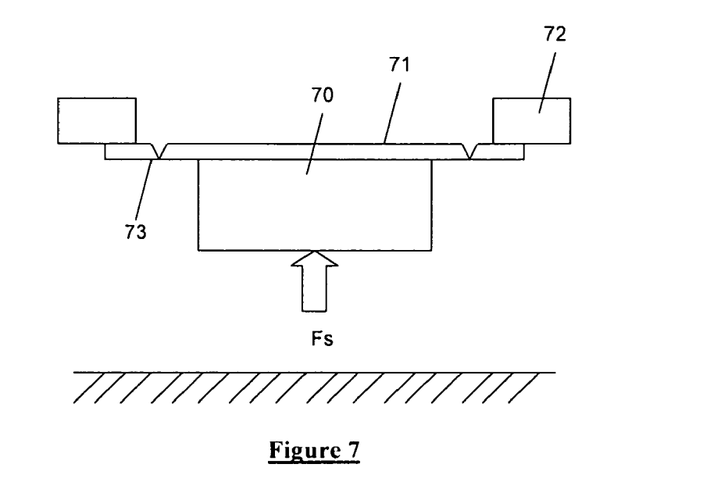

As a further example, in FIG. 7, a template 70 is attached to a board 71. The board 71 is biased against support blocks 72, and has notches 73 formed between the points of support and the region of attachment to the template 70. The notches 73 are weak points in the board, and if the reactive force $F_3$ between the template and the substrate exceeds the force required to break the board at the notches, the board 71 will break and the template will be allowed to move upwards before it causes unwanted damage. This system will typically use a replacement board each time the threshold force is exceeded.

In a development of the systems shown in FIGS. 6 and 7, the template is attached at an upper end to a spring which acts to hold the template in place when it exceeds the threshold force. This prevents the patterned face of the template from being damaged by contact with other elements.

Figure 8:
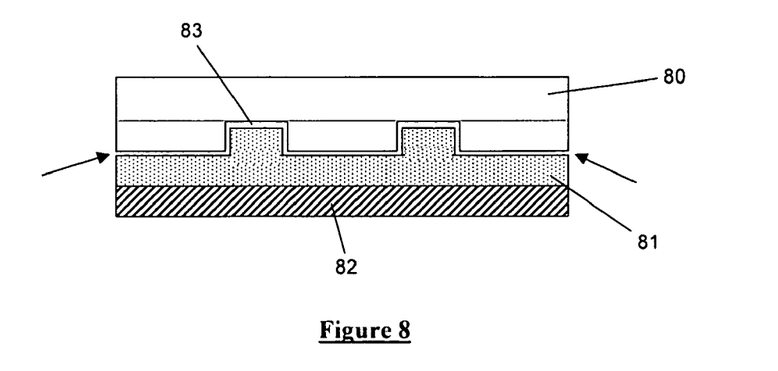

FIG. 8 illustrates a further method for separating a template 80 from an imprinted medium 81 supported on a transfer layer 82 which may reduce a problem connected with pulling or peeling the template 80 from the imprinted medium 81. Pressurized fluid (e.g. air or liquid) is introduced at the edges of the template 80 in the manner indicated by the two arrows in FIG. 8. In this way, the imprinted medium 81 is subjected to a compressive force rather than an extensive force, which imposes less stringent requirements on the strength of the imprinted medium 81. By temporarily compressing the imprinted medium 81, the chance of it sticking to the template 80 is reduced. Since the imprinted medium 81 will typically shrink slightly following curing or polymerization, small gaps 83 are often present between regions of the imprinted medium 81 and the template 80 following imprinting, which can be exploited by the introduction of the pressurized fluid to urge the template 80 and the imprinted medium 81 apart.

While specific embodiments of the invention have been described above, it will be appreciated that the invention may be practiced otherwise than as described. The description is not intended to limit the invention.

We claim:

1. An imprinting apparatus, comprising:
a substrate holder configured to hold a substrate;
a template holder configured to hold a template, the template holder being operable to cause the template to contact an imprintable medium on a target region of a first surface of the substrate to form an imprint in the medium and to cause the template to separate from the imprinted medium, wherein in the absence of a compensating force, the template holder, in use, causes the substrate to deform by the template contacting the imprintable medium; and
a compensating member operable to apply a compensating force; during the template contacting the imprintable medium, to a corresponding location of a second surface of the substrate which is opposite to the first surface so as to reduce deformation of the substrate caused by the template contacting the imprintable medium, wherein the compensating member is operable to provide a compensating force which is substantially equal to or greater than an imprinting force applied to the template to contact the medium to form the imprint in the medium.

2. The imprinting apparatus according to claim 1, wherein the compensating member is operable to apply the compensating force to a portion of the second surface of the substrate which is directly opposite the first target region of the first surface of the substrate.

3. The imprinting apparatus according to claim 1, wherein a first surface of a carrier is configured to hold the substrate and the compensating member directly contacts a second surface of the carrier which is opposite to the first surface of the carrier.

4. The imprinting apparatus according to claim 1, wherein the compensating member is connected to the substrate holder.

5. The imprinting apparatus according to claim 1, wherein the compensating member is a resilient member.

6. The imprinting apparatus according to claim 1, wherein the compensating member is selected from a group consisting of a spring, a piezoelectrically actuated member and a rod displaceably mounted within a coil capable of carrying an electric current.

7. The imprinting apparatus according to claim 1, further comprising a dosing apparatus configured to provide a volume of the imprintable medium on the target region of the first surface of the substrate held on the substrate holder.

8. An imprinting apparatus, comprising:
a substrate holder configured to hold a substrate;
a template holder configured to hold a template, the template holder being operable to apply an imprinting force to the template to cause the template to contact an imprintable medium on a target region of a first surface of the substrate to form an imprint in the medium, the target region having an area less than the area of the first surface of the substrate, and to cause the template to separate from the imprinted medium, wherein in the absence of a compensating force, the template holder, in use, causes the substrate to deform by the template contacting the imprintable medium; and
a compensating member operable to apply a localized compensating force, during application of the imprinting force, to a corresponding location of a second surface of the substrate which is opposite to the first surface of the substrate so as to reduce deformation of the substrate caused by the application of the imprinting force, wherein the compensating member is operable to provide a compensating force which is substantially equal to or greater than an imprinting force applied to the template to contact the medium to form the imprint in the medium.

9. The imprinting apparatus according to claim 8, further comprising a dosing apparatus configured to provide a volume of the imprintable medium on the target region of the first surface of the substrate held on the substrate holder.

10. The imprinting apparatus according to claim 8, wherein the compensating member is operable to apply the compensating force to a portion of the second surface of the substrate which is directly opposite the first target region of the first surface of the substrate.

11. The imprinting apparatus according to claim 8, wherein a first surface of a carrier is configured to hold the substrate and the compensating member directly contacts a second surface of the carrier which is opposite to the first surface of the carrier.

12. The imprinting apparatus according to claim 8, wherein the compensating member is connected to the substrate holder.

13. The imprinting apparatus according to claim 8, wherein the compensating member is a resilient member.

14. The imprinting apparatus according to claim 8, wherein the compensating member is selected from a group consisting of a spring, a piezoelectrically actuated member and a rod displaceably mounted within a coil capable of carrying an electric current.

15. The imprinting apparatus according to claim 8, further comprising a dosing apparatus configured to provide a volume of the imprintable medium on the target region of the first surface of the substrate held on the substrate holder.

* * * * *